(12) United States Patent
Hashimoto et al.

(10) Patent No.: US 7,965,536 B2
(45) Date of Patent: Jun. 21, 2011

(54) FERROELECTRIC MEMORY DEVICE

(75) Inventors: Daisuke Hashimoto, Yokohama (JP);
Daisaburo Takashima, Yokohama (JP);
Hidehiro Shiga, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 87 days.

(21) Appl. No.: 12/560,206

(22) Filed: Sep. 15, 2009

(65) Prior Publication Data

US 2010/0124092 A1    May 20, 2010

(30) Foreign Application Priority Data

Nov. 18, 2008  (JP) .................................. 2008-294787

(51) Int. Cl.
*G11C 11/22* (2006.01)

(52) U.S. Cl. ........ 365/145; 365/65; 365/149; 365/225.7

(58) Field of Classification Search .................... 365/51, 365/52, 65, 145, 149, 225.7
See application file for complete search history.

(56) References Cited

U.S. PATENT DOCUMENTS

| | | | |
|---|---|---|---|
| 5,903,492 A | | 5/1999 | Takashima |
| 6,094,370 A | * | 7/2000 | Takashima ..................... 365/145 |
| 6,320,782 B1 | * | 11/2001 | Takashima ..................... 365/145 |
| 6,473,331 B1 | | 10/2002 | Takashima |
| 6,657,882 B2 | * | 12/2003 | Takashima ..................... 365/145 |
| 7,102,908 B2 | | 9/2006 | Thomas et al. |
| 7,269,048 B2 | | 9/2007 | Takashima |

FOREIGN PATENT DOCUMENTS

| | | |
|---|---|---|
| JP | H03-162798 A | 7/1991 |
| JP | 2006-134529 A | 5/2006 |

OTHER PUBLICATIONS

Hidehiro Shiga et al., "A 1.6GB/s DDR2 128Mb Chain FeRAM with Scalable Octal Bitline and Sensing Schemes", ISSCC Dig Tech Papers. pp. 464-465, Feb. 2009.
Explanation of Non-English Language References.

* cited by examiner

*Primary Examiner* — Gene N. Auduong
(74) *Attorney, Agent, or Firm* — Knobbe, Martens Olson & Bear LLP

(57) ABSTRACT

According to an aspect of the present invention, there is provided a ferroelectric memory device including: a cell unit including: a first select transistor having a first source, a first drain, and a first gate, one of the first source and the first drain being connected to a bit line; and a memory cell unit having a plurality of first memory cells, each of the first memory cells including a first ferroelectric capacitor and a first memory transistor; and a ferroelectric memory fuse including: a second select transistor having a second source, a second drain, and a second gate connected to a second select line, one of the second source and the second drain being connected to one end of the bit line; and a memory fuse unit having a plurality of second memory cells, each of the second memory cells including a second ferroelectric capacitor and a second memory transistor.

7 Claims, 10 Drawing Sheets

CBL1 > CBLn

FERROELECTRIC MEMORY DEVICE

CROSS-REFERENCE TO RELATED APPLICATIONS

This application is based upon and claims the benefit of priority from Japanese Patent Application No. 2008-294787, filed Nov. 18, 2008, the entire contents of which are incorporated herein by reference.

BACKGROUND

1. Field

The present invention relates to a ferroelectric memory device.

2. Description of the Related Art

Next generation nonvolatile memories have been developed which can perform high speed rewriting operations as compared with the known EEPROMs or flash memories, have characteristics that enable great number of rewriting equal to or more than a 5 digit number, and aims at capacitance, speed, and cost equal to that of DRAMs. As next generation nonvolatile memories, there are FeRAM (Ferroelectric Random Access Memory), MRAM (Magnetic Random Access Memory), PRAM (Phase Change Random Access Memory), ReRAM (Resistive Random Access Memory), and the like. FeRAM which is a ferroelectric memory is provided with memory cells including ferroelectric capacitors and memory transistors (see JP-A-2006-134529).

In FeRAM described in JP-A-2006-134529 or the like, information is written in advance in the memory cells, and memory cell arrays are provided with ferroelectric memory fuses (also, referred to as ferro fuses) using the memory cells as fuses by reading the information when the power is switched on.

When the ferroelectric memory fuses share a main memory area and a bit line, bit line capacitance is increases. In this case, there is a difference in bit line capacitance between bit lines that are connected to the ferroelectric memory fuses and bit lines that are not connected to the ferroelectric memory fuses, and thus there is a disadvantage in that the reading margin of cells is reduced. When the capacitance of the bit lines that are not connected to the ferroelectric memory fuses increases to the same value of the capacitance of bit lines that are connected to the ferroelectric memory fuses, there is a disadvantage in that the chip area is drastically increased.

When the ferroelectric memory fuses are independent from the main memory area and have bit lines or sense amplifiers, the bit line capacitance of the main memory area can be made to be uniform. However, when bit lines, sense amplifiers, and a control circuit such as a column decoder are added, there is a disadvantage in that the chip area is drastically increased.

SUMMARY OF THE INVENTION

According to an aspect of the present invention, there is provided a ferroelectric memory device including: a cell unit including: a first select transistor having a first source, a first drain, and a first gate connected to a first select line, one of the first source and the first drain being connected to a bit line; and a memory cell unit having a plurality of first memory cells that are connected serially each other, each of the first memory cells including a first ferroelectric capacitor and a first memory transistor that is connected to the first ferroelectric capacitor parallely, the memory cell unit being provided between a first plate line and the other of the first source and the first drain; and a ferroelectric memory fuse including: a second select transistor having a second source, a second drain, and a second gate connected to a second select line, one of the second source and the second drain being connected to one end of the bit line; and a memory fuse unit having a plurality of second memory cells that are connected serially each other, each of the second memory cells including a second ferroelectric capacitor and a second memory transistor that is connected to the second ferroelectric capacitor parallely, the memory fuse unit being provided between a second plate line and the other of the second source and the second drain, wherein the ferroelectric memory fuse is disposed adjacent to the cell unit, and the first select transistor and the memory cell unit are arranged so as to be parallel with the bit line.

According to another aspect of the present invention, there is provided a ferroelectric memory device including: a cell unit including: a first select transistor having a first source, a first drain, and a first gate connected to a first select line, one of the first source and the first drain being connected to a bit line; a memory cell unit having a plurality of first memory cells that are connected serially each other, each of the first memory cells including a first ferroelectric capacitor and a first memory transistor; and a first reset transistor having a first reset gate connected to a first reset line and provided between the memory cell unit and a first plate line; and a ferroelectric memory fuse including: a second select transistor having a second source, a second drain, and a second gate connected to a second select line, one of the second source and the second drain being connected to one end of the bit line; a memory fuse unit having a plurality of second memory cells that are connected serially each other, each of the second memory cells including a second ferroelectric capacitor and a second memory transistor; and a second reset transistor having a second reset gate connected to a second reset line and provided between a second plate line and the other end of the second source and the second drain, wherein the ferroelectric memory fuse is disposed adjacent to the cell unit, and the first select transistor and the memory cell unit are arranged so as to be parallel with the bit line.

DETAILED DESCRIPTION

Hereinafter, embodiments of the invention will be described with reference to the drawings.

Embodiment 1

Figure 1:
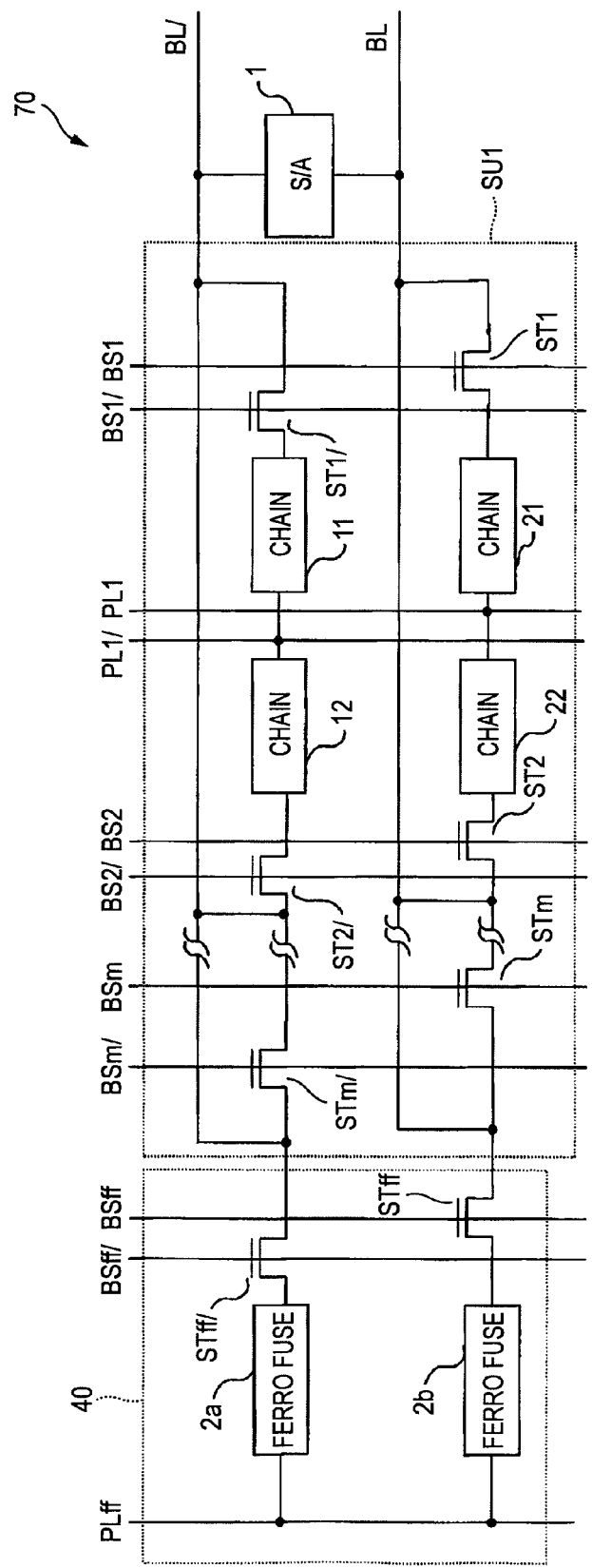
FIG. 1 is a circuit diagram illustrating a ferroelectric memory device according to Embodiment 1.
Figure 2:
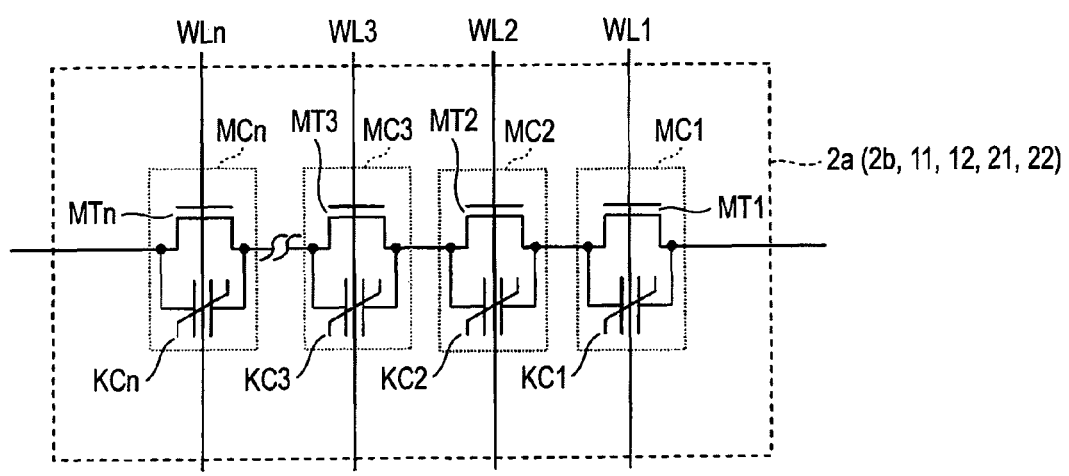
FIG. 2 is a circuit diagram illustrating a memory cell portion and a ferroelectric memory fuse according to Embodiment 1.
Figure 3:
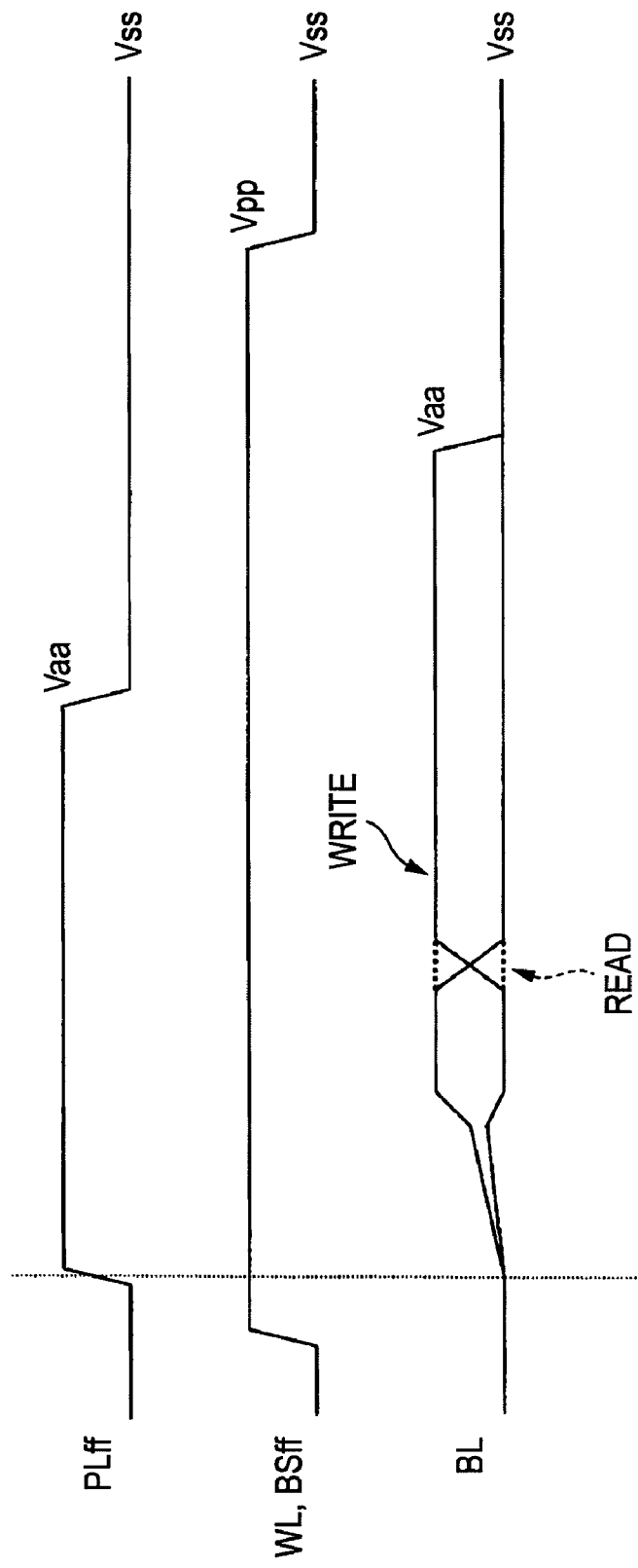
FIG. 3 is a timing chart illustrating a reading operation and a writing operation of the ferroelectric memory fuse according to Embodiment 1.

First, a ferroelectric memory device according to Embodiment 1 of the invention will be described with reference to the drawings. FIG. 1 is a circuit diagram illustrating a ferroelectric memory, FIG. 2 is a circuit diagram illustrating a memory cell portion and a ferroelectric memory fuse, and FIG. 3 is a timing chart illustrating a reading operation and a writing operation of the ferroelectric memory fuse. In the embodiment, the ferroelectric memory fuse that does not share a bit line provided in a cell unit is disposed adjacent to the cell unit.

As shown in FIG. 1, a ferroelectric memory device 70 is provided with a sense amplifier 1, a ferroelectric memory fuse portion 40, and a cell unit SU1. In the ferroelectric memory device 70, the rewriting speed is higher than that of a flash memory, and the number of rewriting times is equal to or more than a 5 digit number. The ferroelectric memory device 70 is an FeRAM (Ferroelectric Random Access Memory) having a plurality of cascade-connected memory cells formed from one memory transistor and one ferroelectric capacitor connected in parallel.

The cell unit SU1 is provided with a memory cell portion 11, a memory cell portion 12, a memory cell portion 21, a memory cell portion 22, a select transistor ST1, a select transistor ST1/, a select transistor ST2, a select transistor ST2/, a select transistor STm, and a select transistor STm/. In the cell unit SU1, m memory cell portions and m select transistors are disposed parallel to a bit line BL, and m memory cell portions and m select transistors are disposed parallel to a bit line BL/. The ferroelectric memory device 70 is provided with a plurality of cell units connected to the bit line BL and the bit line BL/, and thus the plurality of cell units constitute a memory cell array.

In the select transistor ST1/, either a source or a drain is connected to the bit line BL/, the other one out of the source and the drain is connected to the memory cell portion 11, and a gate is connected to a select line BS1/. The select transistor ST1/ controls connection or non-connection between the bit line BL/ and the memory cell portion 11 on the basis of a control signal transmitted to the select line BS1/. The memory cell portion 11 is provided between the other one out of the source and the drain of the select transistor ST1/ and a plate line PL1/.

In the select transistor ST2/, either a source or a drain is connected to the bit line BL/, the other one out of the source and the drain is connected to the memory cell portion 12, and a gate is connected to a select line BS2/. The select transistor ST2/ controls connection or non-connection between the bit line BL/ and the memory cell portion 12 on the basis of a control signal transmitted to the select line BS2/. The memory cell portion 12 is provided between the other one out of the source and the drain of the select transistor ST2/ and the plate line PL1/.

In the select transistor STm/, either a source or a drain is connected to an end portion of the bit line BL/, the other one out of the source and the drain is connected to the memory cell portion 1m (not shown), and a gate is connected to the select line BSm/. The select transistor STm/ controls connection or non-connection between the bit line BL/ and the memory cell portion 1m on the basis of a control signal transmitted to the select line BSm/.

In the select transistor ST1, either a source or a drain is connected to the bit line BL, the other one out of the source and the drain is connected to the memory cell portion 21, and a gate is connected to the select line BS1. The select transistor ST1 controls connection or non-connection between the bit line BL and the memory cell portion 21 on the basis of a control signal transmitted to the select line BS1. The memory cell portion 21 is provided between the other one out of the source and the drain of the select transistor ST1 and a plate line PL1.

In the select transistor ST2, either a source or a drain is connected to the bit line BL, the other one out of the source and the drain is connected to the memory cell portion 22, and a gate is connected to the select line BS2. The select transistor ST2 controls connection or non-connection between the bit line BL and the memory cell portion 22 on the basis of a control signal transmitted to the select line BS2. The memory cell portion 22 is provided between the other one out of the source and the drain of the select transistor ST2 and the plate line PL1.

In the select transistor STm, either a source or a drain is connected to an end portion of the bit line BL, the other one out of the source and the drain is connected to the memory cell portion 2m (not shown), and a gate is connected to the select line BSm. The select transistor STm controls connection or non-connection between the bit line BL and the memory cell portion 2m on the basis of a control signal transmitted to the select line BSm.

The sense amplifier 1 is provided between the bit line BL/ and the bit line BL, amplifies information on the memory cell portion read through the bit line BL/ or the bit line BL, and transmits the amplified information to a column decoder (not shown).

The ferroelectric memory fuse portion 40 is provided with a ferroelectric memory fuse 2a, a ferroelectric memory fuse 2b, a select transistor STff/, and a select transistor STff. The ferroelectric memory fuse portion 40 is disposed adjacent to the cell unit SU1, and the bit line BL/ and the bit line BL provided in the cell unit SU1 do not extend. In addition, ferroelectric memory fuse is also referred to as a ferro fuse.

In the select transistor STff/, either a source or a drain is connected to the end portion of the bit line BL/, the other one out of the source and the drain is connected to the ferroelectric memory fuse 2a, and a gate is connected to a select line BSff/. The select transistor STff/ controls connection or non-connection between the bit line BL/ and the ferroelectric memory fuse 2a on the basis of a control signal transmitted to the select line BSff/. The ferroelectric memory fuse 2a is provided between the other one out of the source and the drain of the select transistor STff/ and a plate line PLff.

In the select transistor STff, either a source or a drain is connected to the end portion of the bit line BL, the other one out of the source and the drain is connected to the ferroelectric memory fuse 2b, and a gate is connected to the select line BSff. The select transistor STff controls connection or non-connection between the bit line BL and the ferroelectric memory fuse 2b on the basis of a control signal transmitted to the select line BSff. The ferroelectric memory fuse 2b is provided between the other one out of the source and the drain of the select transistor STff and the plate line PLff.

A bit line capacitance CBL of the cell unit disposed adjacent to the ferroelectric memory fuse portion and a bit line capacitance CBLX of the cell unit which is not disposed adjacent to the ferroelectric memory fuse portion are set as follows.

$$CBL = CBLX \quad \text{Formula (1)}$$

As shown in FIG. 2, the ferroelectric memory fuse 2a, the ferroelectric memory fuse 2b, the memory cell portion 11, the memory cell portion 12, the memory cell portion 21, and the memory cell portion 22 are provided with cascade-connected n memory cells (memory cell MC1 to MCn).

The memory cell MC1 is connected parallel to a memory transistor MT1 and a ferroelectric capacitor KC1. A gate of the memory transistor MT1 is connected to a word line WL1.

The memory cell MC2 is provided between the memory cell MC1 and the memory cell MC3. The memory cell MC2 is connected parallel to a memory transistor MT2 and a ferroelectric capacitor KC2. A gate of the memory transistor MT2 is connected to a word line WL2.

The memory cell MC3 is provided between the memory cell MC2 and the memory cell MC4 (not shown). The memory cell MC3 is connected parallel to a memory transistor MT3 and a ferroelectric capacitor KC3. A gate of the memory transistor MT3 is connected to a word line WL3.

The memory cell MCn is connected parallel to a memory transistor MTn and a ferroelectric capacitor KCn. A gate of the memory transistor MTn is connected to a word line WLn.

As shown in FIG. 3, a writing operation and a reading operation of the ferroelectric memory fuse are performed in the same manner as the operation of the memory cell portion. For clear representation, the reading operation is represented by broken lines, and the writing operation is represented by solid lines. All control lines and signal lines concerning the reading operation and the writing operation are not represented, but are schematically represented.

Figure 10:
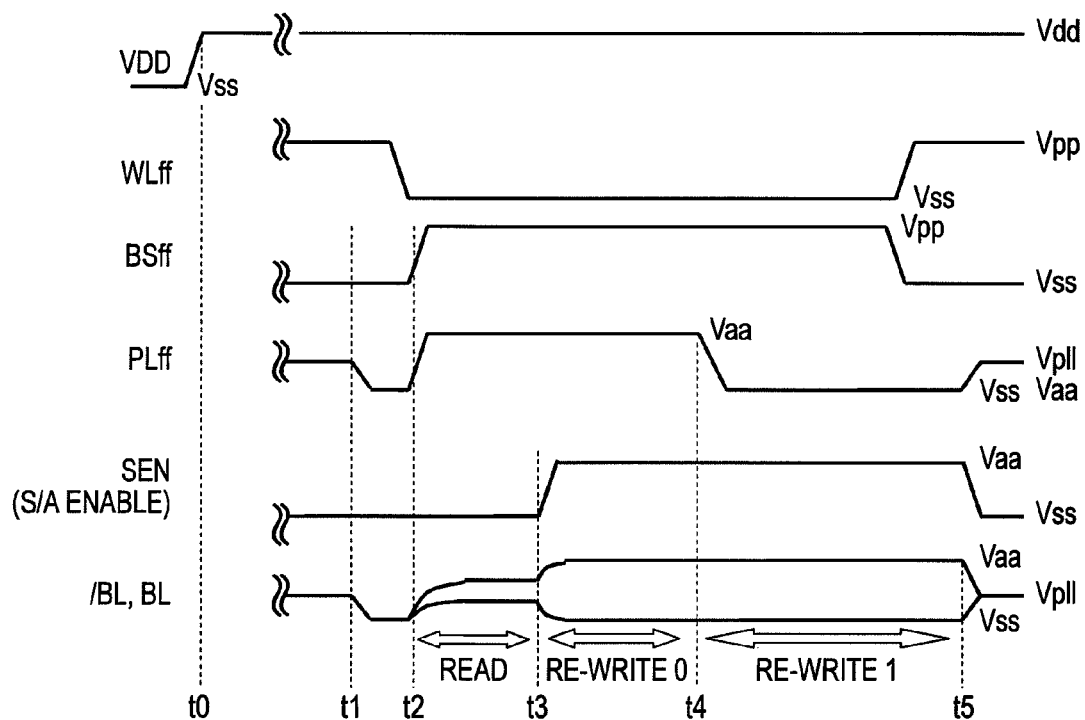
FIG. 10 show wave forms of voltage level with respect to a reading operation of a ferroelectric memory fuse when power is switched on in FeRAM.

Hereinafter, a reading operation of a ferroelectric memory fuse when the power is switched on in the FeRAM shown in FIG. 1 will be described. As shown in FIG. 10, 1st, external power VDD is supplied, and electric potential becomes Vdd (time t0). Then, a word line WLff is free-charged to free-charge potential Vpp, and a plate line PLff and a bit line are free-charged to free-charge potential Vp11. The reading operation of the ferroelectric memory fuse is started from time t1. At time t1, the plate line PLff and the bit lines BL/ and BL are discharged to Vss. At time t2, the BSff and the PLff are charged to Vaa, and electric potential Vaa is applied to the ferroelectric capacitor of the ferroelectric memory fuse portion, thereby outputting electric charges of the ferroelectric capacitor to the bit lines /BL and BL. At time t3, when a signal SEN for driving a sense amplifier is charged to Vaa, '1' data is amplified to Vaa and '0' data is discharged to Vss with respect to the electric potential of the bit lines BL/ and BL. At this time, data of the BL/ and BL is transmitted to a latch and kept. Data of the latch is used as data kept, in the ferroelectric memory fuse later.

The time t2 to t3 is a read cycle, the time t3 to t4 is a rewrite cycle of '0' data, the time t4 to t5 is a rewrite cycle of '1' data, and a specific reading operation control circuit is not necessary in the same manner as the read cycle of the general ferroelectric cell. The difference from the reading operation of the general ferroelectric cell is that the reading operation is started at time t1 after power has been switched on and bit line potential at the time t3 to t4 is transmitted to a predetermined ferroelectric memory fuse data keeping latch circuit and kept.

When the ferroelectric memory fuse portion to which the bit line of the memory cell array does not extend to is disposed adjacent to the cell unit, the ferroelectric memory fuse can be accessed in the completely the same manner for reading and writing as the cell unit that is a main memory area. As a result, it is possible to drastically suppress the increase in the area of a reading and writing circuit corresponding to the ferroelectric memory fuse.

In addition, it is possible to easily evaluate the ferroelectric memory fuse as a die sorter, a package, a module, or the like. Specifically, a specific evaluation device or an analyzing program for a ferroelectric memory fuse is unnecessary, and it is possible to perform a test of the ferroelectric memory fuse using an evaluation device or an analyzing program for a cell unit that is a main memory area. As a result, it is possible to reduce the test costs, and it is possible to drastically suppress the inconveniences involved in tests.

Figure 4:
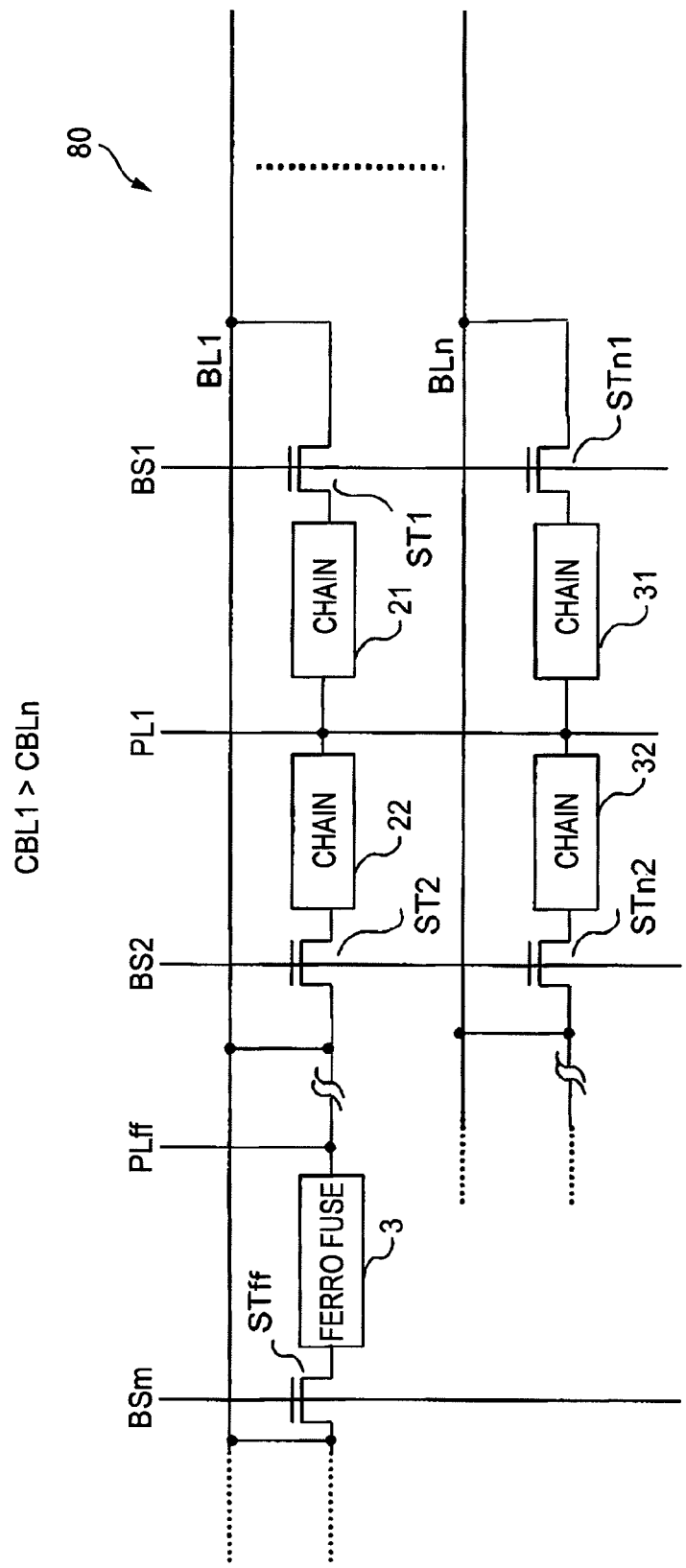
FIG. 4 is a circuit diagram illustrating a ferroelectric memory device of a comparative example according to Embodiment 1.

Next, a ferroelectric memory device according to a comparative example will be described with reference to FIG. 4. FIG. 4 is a circuit diagram illustrating the ferroelectric memory device according to the comparative example.

As shown in FIG. 4, a ferroelectric memory device 80 according to the comparative example is provided with a ferroelectric memory fuse 3, a memory cell portion 21, a memory cell portion 22, a memory cell portion 31, a memory cell portion 32, a select transistor ST1, a select transistor ST2, a select transistor STn1, a select transistor STn2, and a select transistor STff. In the ferroelectric memory device 80 according to the comparative example, the ferroelectric memory fuse 3 and the select transistor STff are provided in the cell unit, and a bit line BL1 extends to the ferroelectric memory fuse 3 and the select transistor STff.

In the select transistor ST1, either a source or a drain is connected to the bit line BL1, the other one out of the source and the drain is connected to the memory cell portion 21, and a gate is connected to the select line BS1. The select transistor ST1 controls connection or non-connection between the bit line BL1 and the memory cell portion 21 on the basis of a control signal transmitted to the select line BS1.

In the select transistor ST2, either a source or a drain is connected to the bit line BL1, the other one out of the source and the drain is connected to the memory cell portion 22, and a gate is connected to the select line BS2. The select transistor ST2 controls connection or non-connection between the bit line BL1 and the memory cell portion 22 on the basis of a control signal transmitted to the select line BS2.

In the select transistor STff, either a source or a drain is connected to the bit line BL1, the other one out of the source and the drain is connected to the ferroelectric memory fuse 3, and a gate is connected to the select line BSm. The ferroelectric memory fuse 3 is provided between the other one out of the source and the drain of the select transistor STff and a plate line PLff. The select transistor STff controls connection or non-connection between the bit line BL1 and the ferroelectric memory fuse 3 on the basis of a control signal transmitted to the select line BSm.

In the select transistor STn1, either a source or a drain is connected to the bit line BLn, the other one out of the source and the drain is connected to the memory cell portion 31, and a gate is connected to the select line BS1. The memory cell portion 31 is provided between the other one out of the source and the drain of the select transistor STn1 and the plate line PL1. The select transistor STn1 controls connection or non-connection between the bit line BLn and the memory cell portion 31 on the basis of a control signal transmitted to the select line BS1.

In the select transistor STn2, either a source or a drain is connected to the bit line BLn, the other one out of the source and the drain is connected to the memory cell portion 32, and a gate is connected to the select line BS2. The memory cell portion 32 is provided between the other one out of the source and the drain of the select transistor STn2 and the plate line PL1. The select transistor STn2 controls connection or non-connection between the bit line BLn and the memory cell portion 32 on the basis of a control signal transmitted to the select line BS2.

The ferroelectric memory fuse 3, the memory cell portion 31, and the memory cell portion 32 have the same structures as those of the ferroelectric memory fuse 2a, the ferroelectric memory fuse 2b, the memory cell portion 11, the memory cell portion 12, the memory cell portion 21, and the memory cell portion 22 shown in FIG. 2.

A bit line capacitance of the bit line BL1 is represented by CBL1 and a bit line capacitance of the bit line BLn is represented by CBLn. The select transistor STff and the ferroelectric memory fuse 3 are added to the bit line BL1, and thus the relationship between the bit line capacitance CBL1 and the bit line capacitance CBLn is represented as follows.

$$CBL1 > CBLn \qquad \text{Formula (2)}$$

As a result, in the ferroelectric memory device 80 according to the comparative example, in the bit line that is connected to the ferroelectric memory fuse and the bit line that is not connected to the ferroelectric memory fuse, there is a difference in the bit line capacitance, and thus the reading margin of the cell decreases.

As described above, the ferroelectric memory device according to the embodiment is provided with the sense amplifier 1, the ferroelectric memory fuse portion 40, and the cell unit SU1. The cell unit SU1 is provided with the memory cell portion 11, the memory cell portion 12, the memory cell portion 21, the memory cell portion 22, the select transistor ST1, the select transistor ST1/, the select transistor ST2, the select transistor ST2/, the select transistor STm, and the select transistor STm/. The ferroelectric memory fuse portion 40 is provided with the ferroelectric memory fuse 2a, the ferroelectric memory fuse 2b, the select transistor STff/, and the select transistor STff. The ferroelectric memory fuse portion 40 is disposed adjacent to the cell unit SU1. The ferroelectric memory fuses 2a and 2b have the same structures as those of the memory cell portion 11, the memory cell portion 12, the memory cell portion 21, and the memory cell portion 22 provided in the cell unit SU1. The bit line BL and the bit line BL/ provided in the cell unit SU1 do not extend to the ferroelectric memory fuse portion 40.

For this reason, there is no difference in bit line capacitance between the bit line that is connected to the ferroelectric memory fuse and the bit line that is not connected to the ferroelectric memory fuse.

The ferroelectric memory fuse can be accessed in the same manner for reading and writing as the cell unit that is the main memory area. Accordingly, it is possible to drastically suppress the increase in the area of a reading and writing circuit corresponding to the ferroelectric memory fuse.

In addition, it is possible to easily evaluate the ferroelectric memory fuse as a die sorter, a package, a module, or the like. It is possible to reduce the test costs of the ferroelectric memory device 70, and it is possible to drastically suppress the inconveniences involved in tests.

In the embodiment, the ferroelectric memory fuse 2a and the ferroelectric memory fuse 2b share the plate line PLff, but separate plate lines may be provided. In addition, the number of cascade-connected memory cells of the memory cell portion and the number of cascade-connected ferroelectric memory fuses are set to be equal to each other, but the invention is not necessarily limited thereto. The number of cascade connections may be appropriately modified.

Embodiment 2

Figure 5A:
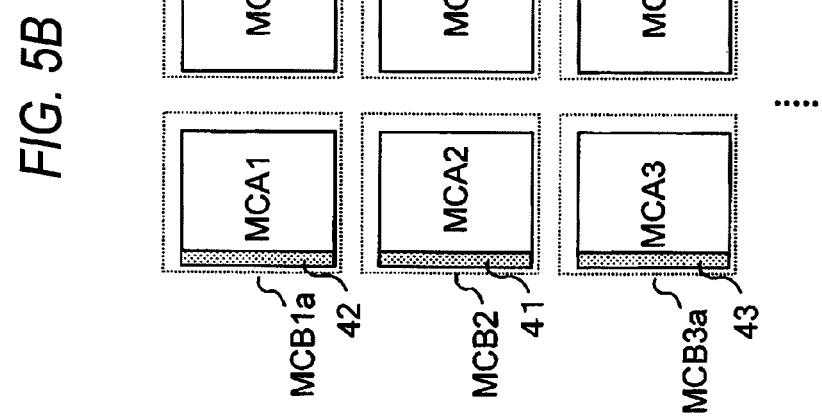
FIGS. 5A and 5B are block diagrams each illustrating a ferroelectric memory device according to Embodiment 2.
Figure 5B:
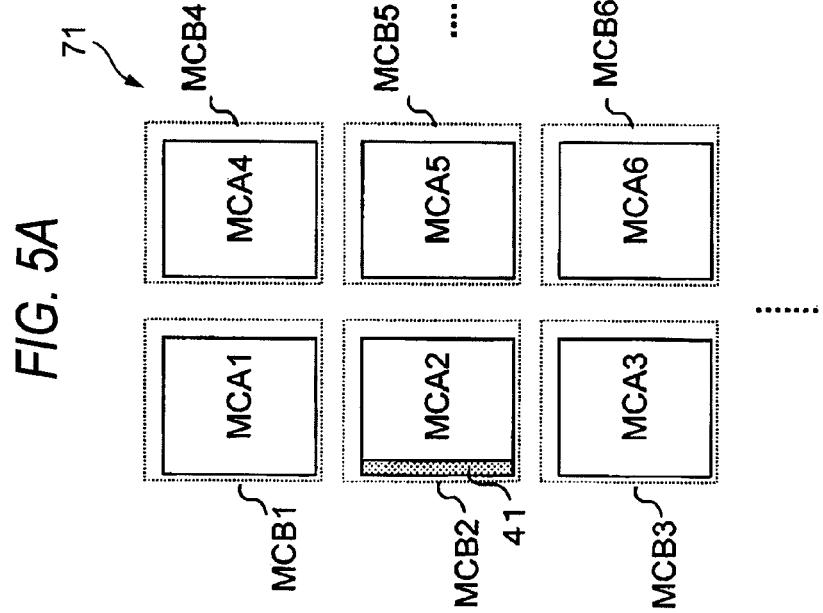

Next, a ferroelectric memory device according to Embodiment 2 of the invention will be described with reference to the drawings. FIGS. 5A and 5B are block diagrams each illustrating a ferroelectric memory device. In the embodiment, the ferroelectric memory fuse portion is provided at the end portion of the memory array.

As shown in FIG. 5A, a ferroelectric memory device 71 is provided with memory cell blocks MCB1 to MCB6. The ferroelectric memory device 71 is an FeRAM (Ferroelectric Random Access Memory) having a plurality of cascade-connected memory cells formed from a memory transistor and a ferroelectric capacitor connected in parallel.

The memory cell block MCB1, the memory cell block MCB3, the memory cell block MCB4, the memory cell block MCB5, and the memory cell block MCB6 are respectively provided with a memory cell array MCA1, a memory cell array MCA3, a memory cell array MCA4, a memory cell array MCA5, and a memory cell array MCA6. The memory cell block is provided with a sense amplifier, a column decoder, and a row decoder (not shown) in addition to the memory cell array.

The memory cell block MCB2 is provided with a memory cell array MCA2 and a ferroelectric memory fuse portion 41, and is provided with a sense amplifier, a column decoder, and a row decoder (not shown). The ferroelectric memory fuse portion 41 is disposed adjacent to the memory cell array MCA2. The ferroelectric memory fuse portion 41 is provided with a ferroelectric memory fuse having the same structure as that of the memory cell portion in the same manner as Embodiment 1.

As shown in FIG. 5B, a ferroelectric memory device 72 is provided with a memory cell block MCB1a, a memory cell block MCB2, a memory cell block MCB3a, and memory cell blocks MCB4 to MCB6. The ferroelectric memory device 72 is an FeRAM (Ferroelectric Random Access Memory) having a plurality of cascade-connected memory cells formed from a memory transistor and a ferroelectric capacitor connected in parallel.

The memory cell block MCB1a is provided with the memory cell array MCA1 and a ferroelectric memory fuse portion 42, and is provided with a sense amplifier, a column decoder, and a row decoder (not shown). The ferroelectric memory fuse portion 42 is disposed adjacent to the memory cell array MCA1. The ferroelectric memory fuse portion 42 is provided with a ferroelectric memory fuse having the same structure as that of the memory cell portion in the same manner as Embodiment 1.

The memory cell block MCB3a is provided with the memory cell array MCA3 and a ferroelectric memory fuse portion 43, and is provided with a sense amplifier, a column decoder, and a row decoder (not shown). The ferroelectric memory fuse portion 43 is disposed adjacent to the memory cell array MCA3. The ferroelectric memory fuse portion 43 is provided with a ferroelectric memory fuse having the same structure as that of the memory cell portion in the same manner as Embodiment 1. The memory cell array is also referred to as a memory mat.

In the ferroelectric memory devices 71 and 72, the ferroelectric memory fuse portion can be disposed at any memory block. In addition, in the memory cell block having the ferroelectric memory fuse portion disposed adjacent to the memory cell array and the memory cell block having no ferroelectric memory fuse portion, there is no difference in bit line capacitance. As a result, it is possible to suppress the increase in chip area in the case when a ferroelectric memory fuse is mounted. In addition, the number of memory cell blocks on which the ferroelectric memory fuse is mounted can be modified according to the capacitance of the used ferroelectric memory fuse, and the chip area can be constantly at a minimum.

As described above, in the ferroelectric memory device according to the embodiment, any memory cell block from the plurality of memory cell blocks having memory cell array therein is provided with the ferroelectric memory fuse portion disposed adjacent to the memory cell array. The bit line provided in the memory cell array does not extend to the ferroelectric memory fuse portion.

For this reason, there is no difference in bit line capacitance between the memory cell block having the ferroelectric memory fuse portion disposed adjacent to the memory cell array and the memory cell block having no ferroelectric memory fuse portion. Accordingly, it is possible to suppress the increase in the chip area in the case when a ferroelectric memory fuse is mounted.

Embodiment 3

Figure 6:
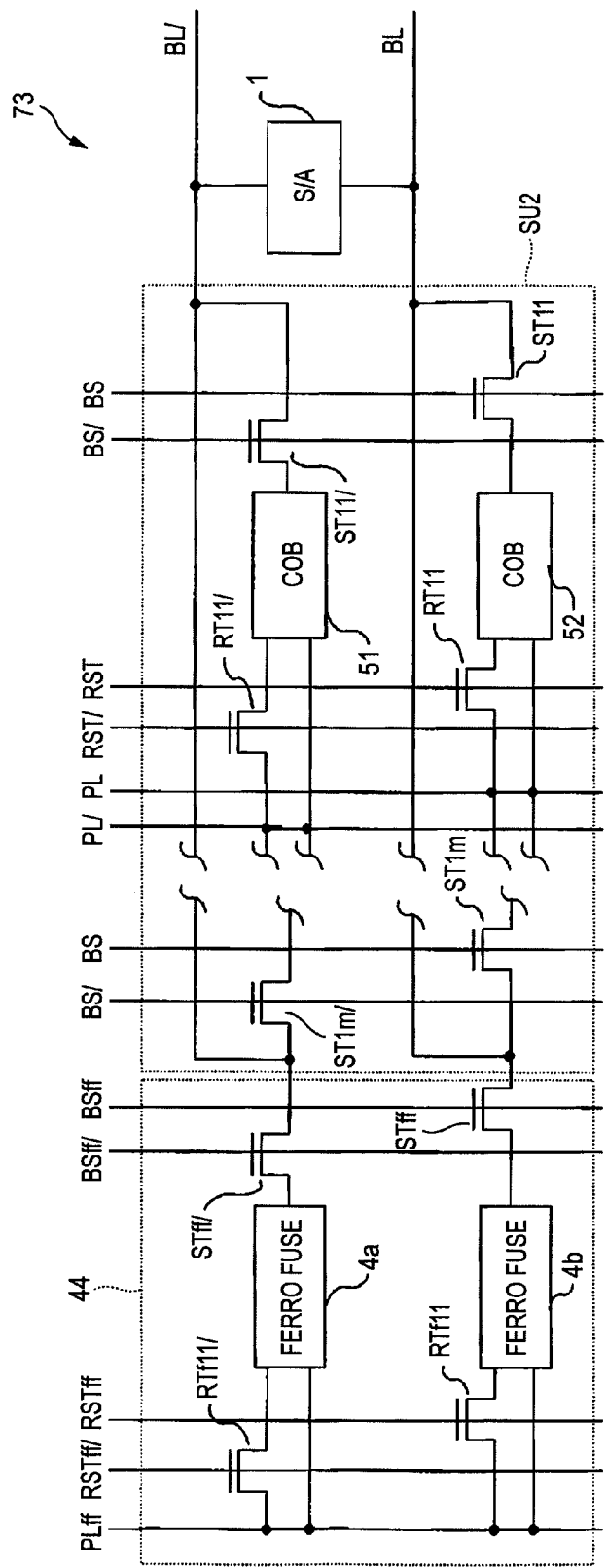
FIG. 6 is a circuit diagram illustrating a ferroelectric memory device according to Embodiment 3.
Figure 7:
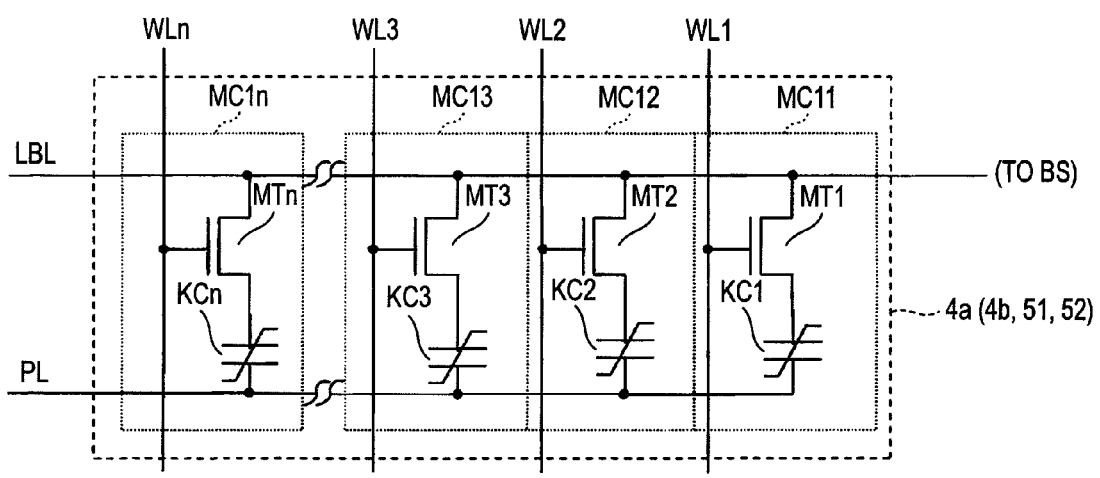
FIG. 7 is a circuit diagram illustrating a memory cell portion and a ferroelectric memory fuse according to Embodiment 3.

Next, a ferroelectric memory device according to Embodiment 3 of the invention will be described with reference to the drawings. FIG. 6 is a circuit diagram illustrating a ferroelectric memory device, and FIG. 7 is a circuit diagram illustrating a memory cell portion and a ferroelectric memory fuse. In the embodiment, the configurations of the memory cell portion and the ferroelectric memory fuse are modified.

Hereinafter, the same reference numerals and signs are given to the same constituent elements as those of Embodiment 1, and the description thereof is omitted. Only different parts are described.

As shown in FIG. 6, a ferroelectric memory device 73 is provided with a sense amplifier 1, a ferroelectric memory fuse portion 44, and a cell unit SU2. In the ferroelectric memory device 73, the rewriting speed is higher than that of a flash memory, the number of rewriting times is equal to or more than a 5 digit number and the ferroelectric memory device 73 is a 1T1C-type (one memory transistor and one ferroelectric capacitor) FeRAM (Ferroelectric Random Access Memory).

In the embodiment, the 1T1C-type memory cells are used, but 2T2C-type or 6T4C-type memory cells may be used instead.

The cell unit SU2 is provided with a memory cell portion 51, a memory cell portion 52, a select transistor ST11, a select transistor ST11/, a select transistor ST1m, a select transistor ST1m/, a reset transistor RT11, and a reset transistor RT11/. In the cell unit SU2, m select transistors, m memory cell portions, and m reset transistors are disposed parallel to a bit line BL/, and m select transistors, m memory cell portions, and m reset transistors are disposed parallel to a bit line BL. The ferroelectric memory device 73 is provided with a plurality of cell units connected to the bit line BL and the bit line BL/, and thus the plurality of cell units constitute a cell array.

In the select transistor ST11/, either a source or a drain is connected to the bit line BL/, the other one out of the source and the drain is connected to the memory cell portion 51, and a gate is connected to a select line BS/. The select transistor ST11/ controls connection or non-connection between the bit line BL/ and the memory cell portion 51 on the basis of a control signal transmitted to the select line BS/. The memory cell portion 51 is connected to the other one out of the source and the drain of the select transistor ST11/. In the reset transistor RT11/, either a source and a drain is connected to a local bit line of the memory cell portion 51, the other one out of the source and the drain is connected to a plate line PL/, and a gate is connected to a reset line RST/. The reset transistor RT11/ controls connection or non-connection between the plate line PL/ and the local bit line of the memory cell portion 51 on the basis of a control signal transmitted to the reset line RST/. Details of the local bit line will be described later.

In the select transistor ST1m/, either a source or a drain is connected to an end portion of the bit line BL/, the other one out of the source and the drain is connected to a (m−1)th memory cell portion (not shown), and a gate is connected to the select line BS/. The select transistor ST1m/ controls connection or non-connection between the bit line BL/ and the (m−1)th memory cell portion on the basis of a control signal transmitted to the select line BS/.

In the select transistor ST11, either a source or a drain is connected to the bit line BL, the other one out of the source and the drain is connected to the memory cell portion 52, and a gate is connected to the select line BS. The select transistor ST11 controls connection or non-connection between the bit line BL and the memory cell portion 52 on the basis of a control signal transmitted to the select line BS. The memory cell portion 52 is connected to the other one out of the source and the drain of the select transistor ST11. In the reset transistor RT11, either a source or a drain is connected to a local bit line of the memory cell portion 52, the other one out of the source and the drain is connected to the plate line PL, and a gate is connected to a reset line RST. The reset transistor RT11 controls connection or non-connection between the plate line PL and the local bit line of the memory cell portion 52 on the basis of a control signal transmitted to the reset line RST.

In the select transistor ST1m, either a source or a drain is connected to the end portion of the bit line BL, the other one out of the source and the drain is connected to the (m−1)th memory cell portion (not shown), and a gate is connected to the select line BS. The select transistor ST1m controls connection or non-connection between the bit line BL and the (m−1)th memory cell portion on the basis of a control signal transmitted to the select line BS.

The ferroelectric memory fuse portion 44 is provided with a ferroelectric memory fuse 4a, a ferroelectric memory fuse 4b, a select transistor STff/, a select transistor STff, a reset transistor RTf11/, and a reset transistor RTf11. The ferroelectric memory fuse portion 44 is disposed adjacent to the cell unit SU2, and the bit line BL/ and the bit line BL provided in the cell unit SU2 do not extend to the ferroelectric memory fuse portion 44.

In the select transistor STff/, either a source or a drain is connected to the end portion of the bit line BL/, the other one out of the source and the drain is connected to the ferroelectric memory fuse 4a, and a gate is connected to a select line BSff/. The select transistor STff/ controls connection or non-connection between the bit line BL/ and the ferroelectric memory fuse 4a on the basis of a control signal transmitted to the select line BSff/. The ferroelectric memory fuse 4a is connected to the other one out of the source and the drain of the select transistor STff/. In the reset transistor RTf11/, either a source or a drain is connected to a local bit line of the ferroelectric memory fuse 4a, the other one out of the source and the drain is connected to a plate line PLff, and a gate is connected to a reset line RSTff/. The reset transistor RTf11/ controls connection or non-connection between the plate line PLff and the local bit line of the ferroelectric memory fuse 4a on the basis of a control signal transmitted to the reset line RSTff/.

In the select transistor STff, either a source or a drain is connected to the end portion of the bit line BL, the other one out of the source and the drain is connected to the ferroelectric memory fuse 4b, and a gate is connected to a select line BSff. The select transistor STff controls connection or non-connection between the bit line BL and the ferroelectric memory fuse 4b on the basis of a control signal transmitted to a select line BSff. The ferroelectric memory fuse 4b is connected to the other one out of the source and the drain of the select transistor STff. In the reset transistor RTf11, either a source or a drain is connected to a local bit line of the ferroelectric memory fuse 4b, the other one out of the source and the drain is connected to the plate line PLff, and a gate is connected to the reset line RSTff. The reset transistor RTf11 controls connection or non-connection between the plate line PLff and the local bit line of the ferroelectric memory fuse 4b on the basis of a control signal transmitted to the reset line RSTff.

A bit line capacitance CBL of the cell unit that is disposed adjacent to the ferroelectric memory fuse portion and a bit line capacitance CBLX of the cell unit that is not disposed adjacent to the ferroelectric memory fuse portion are set such that (CBL=CBLX) in the same manner as Embodiment 1.

As shown in FIG. 7, each of the ferroelectric memory fuse 4a, the ferroelectric memory fuse 4b, the memory cell portion 51, and the memory cell portion 52 is provided with n cascade-connected memory cells (memory cells MC11 to MC1n). The ferroelectric memory fuse 4a, the ferroelectric memory fuse 4b, the memory cell portion 51, and the memory cell portion 52 have a ladder COB (Capacitance Over Bit Line) structure.

A memory transistor MT1 and a ferroelectric capacitor KC1 are serially connected to the memory cell MC11. In the memory transistor MT1, either a source or a drain is connected to a local bit line LBL, and a gate is connected to a word line WL1. One end of the local bit line LBL is connected to the bit line BL through a select transistor. One end of the ferroelectric capacitor KC1 is connected to the other one out of the source and the drain of the memory transistor MT1, and the other end is connected to the plate line PL.

The memory cell MC12 is provided between the memory cell MC11 and the memory cell MC13. A memory transistor MT2 and a ferroelectric capacitor KC2 are serially connected to the memory cell MC12. In the memory transistor MT2, either a source or a drain is connected to the local bit line LBL, and a gate is connected to a word line WL2. One end of the ferroelectric capacitor KC2 is connected to the other one out of the source and the drain of the memory transistor MT2, and the other end is connected to the plate line PL.

The memory cell MC13 is provided between the memory cell MC12 and the memory cell MC14 (not shown). A memory transistor MT3 and a ferroelectric capacitor KC3 are serially connected to the memory cell MC13. In the memory transistor MT3, either a source or a drain is connected to the local bit line LBL, and a gate is connected to a word line WL3. One end of the ferroelectric capacitor KC3 is connected to the other one out of the source and the drain of the memory transistor MT3, and the other end is connected to the plate line PL.

A memory transistor MTn and a ferroelectric capacitor KCn are serially connected to the memory cell MC1n. In the memory transistor MTn, either a source or a drain is connected to the local bit line LBL, and a gate is connected to a word line WLn. One end of the ferroelectric capacitor KCn is connected to the other one out of the source and the drain of the memory transistor MTn, and the other end is connected to the plate line PL. The other end of the local bit line LBL is connected to the plate line PL through a reset transistor.

As described above, the ferroelectric memory device according to the embodiment is provided with the sense amplifier 1, the ferroelectric memory fuse portion 44, and the cell unit SU2. The cell unit SU2 is provided with the memory cell portion 51, the memory cell portion 52, the select transistor ST11, the select transistor ST11/, the select transistor ST1m, the select transistor ST1m/, the reset transistor RT11, and the reset transistor RT11/. The ferroelectric memory fuse portion 44 is provided with the ferroelectric memory fuse 4a, the ferroelectric memory fuse 4b, the select transistor STff/, the select transistor STff, the reset transistor RTf11/, and the reset transistor RTf11. The ferroelectric memory fuse portion 44 is disposed adjacent to the cell unit SU2. The ferroelectric memory fuses 4a and 4b have the same structure as those of the memory cell portion 51 and the memory cell portion 52 provided in the cell unit SU2. The bit line BL and the bit line BL/ provided in the cell unit SU2 do not extend to the ferroelectric memory fuse portion 44.

For this reason, there is no difference in bit line capacitance between the bit line that is connected to the ferroelectric memory fuse and the bit line that is not connected to the ferroelectric memory fuse. The ferroelectric memory fuse can be accessed in the completely the same manner for reading and writing as the cell unit that is a main memory area. As a result, it is possible to drastically suppress the increase in the area of a reading and writing circuit corresponding to the ferroelectric memory fuse.

It is possible to easily evaluate the ferroelectric memory fuse as a die sorter, a package, a module, or the like. It is possible to reduce the test costs of the ferroelectric memory device 73, and it is possible to drastically suppress the inconveniences involved in tests.

Embodiment 4

Figure 9:
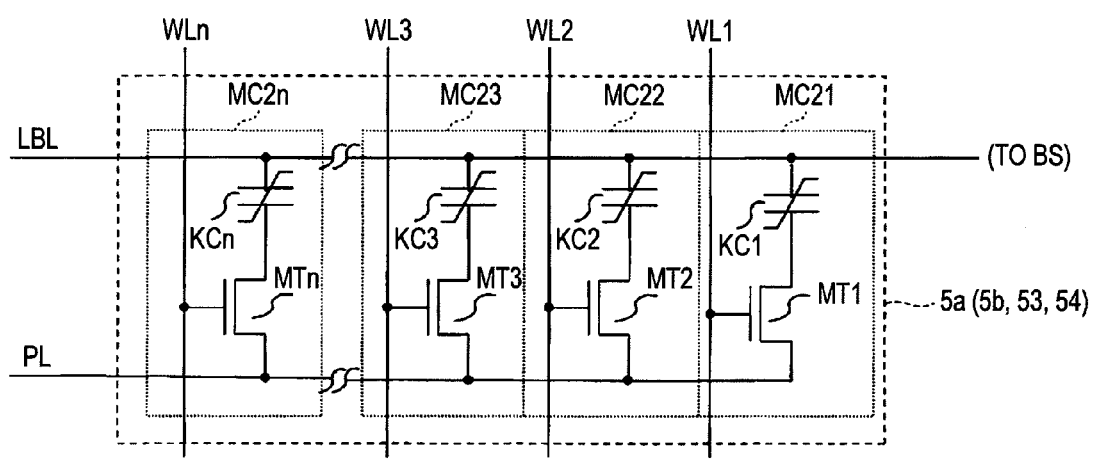
FIG. 9 is a circuit diagram illustrating a memory cell portion and a ferroelectric memory fuse according to Embodiment 4.

Next, a ferroelectric memory device according to Embodiment 4 of the invention will be described with reference to the drawings. FIG. 3 is a circuit diagram illustrating the ferroelectric memory device, and FIG. 9 is a circuit diagram illustrating a memory cell portion and a ferroelectric memory fuse. In the embodiment, the configurations of the memory cell portion and the ferroelectric memory fuse are modified.

Hereinafter, the same reference numerals and signs are given to the same constituent elements as those of Embodiment 3, and the description thereof is omitted. Only different parts are described.

Figure 8:
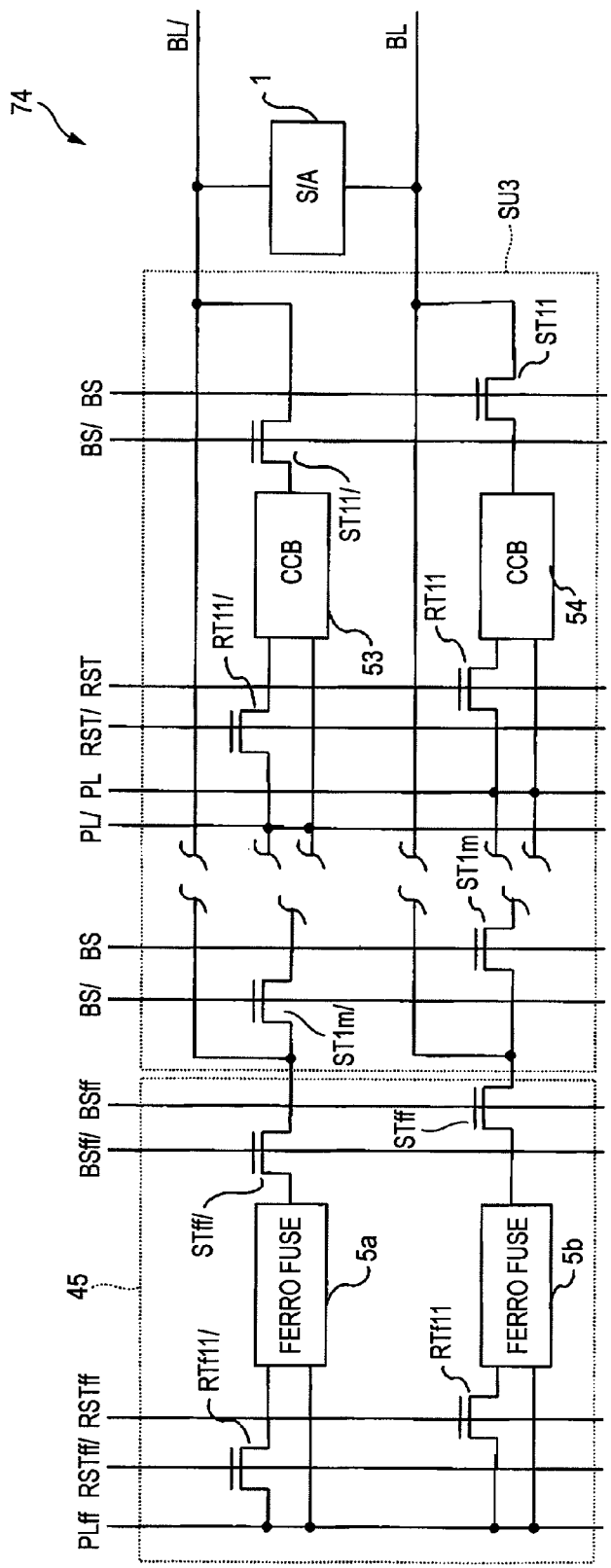
FIG. 8 is a circuit diagram illustrating a ferroelectric memory device according to Embodiment 4.

As shown in FIG. 8, a ferroelectric memory device 74 is provided with a sense amplifier 1, a ferroelectric memory fuse portion 45, and a cell unit SU3. In the ferroelectric memory device 74, the rewriting speed is higher than that of a flash memory, the number of rewriting times is equal to or more than a 5 digit number and the ferroelectric memory device 73 is a 1T1C-type (one memory transistor and one ferroelectric capacitor) FeRAM (Ferroelectric Random Access Memory).

In the embodiment, the 1T1C-type memory cells are used, but 2T2C-type or 6T4C-type memory cells may be used instead.

The cell unit SU3 is provided with a memory cell portion 53, a memory cell portion 54, a select transistor ST11, a select transistor ST11/, a select transistor ST1m, a select transistor ST1m/, a reset transistor RT11, and a reset transistor RT11/. In the cell unit SU3, m select transistors, m memory cell portions, and m reset transistors are disposed parallel to a bit line BL/, and m select transistors, m memory cell portions, and m reset transistors are disposed parallel to a bit line BL. The ferroelectric memory device 74 is provided with a plurality of cell units connected to the bit line BL and the bit line BL/, and thus the plurality of cell units constitute a cell array.

The memory cell portion 53 is connected to the other one out of a source and a drain of the select transistor ST11/. In the reset transistor RT11/, either a source or a drain is connected to a local bit line of the memory cell portion 53, the other one out of the source and the drain is connected to a plate line PL/, and a gate is connected to a reset line RST/. The reset transistor RT11/ controls connection or non-connection between the plate line PL/ and the local bit line of the memory cell portion 53 on the basis of a control signal transmitted to the reset line RST/.

The memory cell portion 54 is connected to the other one out of a source and a drain of the select transistor ST11. In the reset transistor RT11, either a source or a drain is connected to a local bit line of the memory cell portion 54, the other one out of the source and the drain is connected to a plate line PL, and a gate is connected to a reset line RST. The reset transistor RT11 controls connection or non-connection between the plate line PL and the local bit line of the memory cell portion 54 on the basis of a control signal transmitted to the reset line RST.

The ferroelectric memory fuse portion 45 is provided with a ferroelectric memory fuse 5a, a ferroelectric memory fuse 5b, a select transistor STff/, a select transistor STff, a reset transistor RTf11/, and a reset transistor RTf11. The ferroelectric memory fuse portion 45 is disposed adjacent to the cell unit SU3, and the bit line BL/ and the bit line BL provided in the cell unit SU3 do not extend to the ferroelectric memory fuse portion 45.

The ferroelectric memory fuse 5a is connected to the other one out of a source and a drain of the select transistor STff/. In the reset transistor RTf11/, either a source or a drain is connected to a local bit line of the ferroelectric memory fuse 5a, the other one out of the source and the drain is connected to a plate line PLff, and a gate is connected to a reset line RSTff/. The reset transistor RTf11/ controls connection or non-connection between the plate line PLff and the local bit line of the ferroelectric memory fuse 5a on the basis of a control signal transmitted to the reset line RSTff/.

The ferroelectric memory fuse 5b is connected to the other one out of a source and a drain of the select transistor STff. In the reset transistor RTf11, either a source or a drain is connected to a local bit line of the ferroelectric memory fuse 5b, the other one out of the source and the drain is connected to the plate line PLff, and a gate is connected to a reset line RSTff. The reset transistor RTf11 controls connection or non-connection between the plate line PLff and the local bit line of the ferroelectric memory fuse 5b on the basis of a control signal transmitted to the reset line RSTff.

A bit line capacitance CBL of the cell unit that is disposed adjacent to the ferroelectric memory fuse portion and a bit line capacitance CBLX of the cell unit that is not disposed adjacent to the ferroelectric memory fuse portion are set such that (CBL=CBLX) in the same manner as Embodiment 1.

As shown in FIG. 9, each of the ferroelectric memory fuse 5a, the ferroelectric memory fuse 5b, the memory cell portion 53, and the memory cell portion 54 is provided with n cascade-connected memory cells (memory cells MC21 to MC2n). The ferroelectric memory fuse 5a, the ferroelectric memory fuse 5b, the memory cell portion 53, and the memory cell portion 54 have a ladder CCB (Capacitance Coupled Bit Line Cell) structure.

A ferroelectric capacitor KC1 and a memory transistor MT1 are serially connected to the memory cell MC21. One end of the ferroelectric capacitor KC1 is connected to a local bit line LBL. One end of the local bit line LBL is connected to the bit line BL through a select transistor. In the memory transistor MT1, either a source or a drain is connected to the other end of the ferroelectric capacitor KC1, a gate is connected to a word line WL1, and the other one out of the source and the drain is connected to the plate line PL.

The memory cell MC22 is provided between the memory cell MC21 and the memory cell MC23. A ferroelectric capacitor KC2 and a memory transistor MT2 are serially connected to the memory cell MC22. One end of the ferroelectric capacitor KC2 is connected to the local bit line LBL. In the memory transistor MT2, either a source or a drain is connected to the other end of the ferroelectric capacitor KC2, a gate is connected to a word line WL2, and the other one out of the source and the drain is connected to the plate line PL.

The memory cell MC23 is provided between the memory cell MC22 and the memory cell MC24 (not shown). A ferroelectric capacitor KC3 and a memory transistor MT3 are serially connected to the memory cell MC23. One end of the ferroelectric capacitor KC3 is connected to the local bit line LBL. In the memory transistor MT3, either a source or a drain is connected to the other end of the ferroelectric capacitor KC3, a gate is connected to a word line WL3, and the other one out of the source and the drain is connected to the plate line PL.

A ferroelectric capacitor KCn and a memory transistor MTn are serially connected to the memory cell MC2n. One end of the ferroelectric capacitor KCn is connected to the local bit line LBL. In the memory transistor MTn, either a source or a drain is connected to the other end of the ferroelectric capacitor KCn, a gate is connected to a word line WLn, and the other one out of the source and the drain is connected to the plate line PL. The other end of the local bit line LBL is connected to the plate line PL through a reset transistor.

As described above, the ferroelectric memory device according to the embodiment is provided with the sense amplifier 1, the ferroelectric memory fuse portion 45, and the cell unit SU3. The cell unit SU3 is provided with the memory cell portion 53, the memory cell portion 54, the select transistor ST11, the select transistor ST11/, the select transistor ST1m, the select transistor ST1m/, the reset transistor RT11, and the reset transistor RT11/. The ferroelectric memory fuse portion 45 is provided with the ferroelectric memory fuse 5a, the ferroelectric memory fuse 5b, the select transistor STff/, the select transistor STff, the reset transistor RTf11/, and the reset transistor RTf11. The ferroelectric memory fuse portion 45 is disposed adjacent to the cell unit SU3. The ferroelectric memory fuses 5a and 5b have the same structure as those of the memory cell portion 53 and the memory cell portion 54 provided in the cell unit SU3. The bit line BL and the bit line BL/ provided in the cell unit SU3 do not extend to the ferroelectric memory fuse portion 45.

For this reason, there is no difference in bit line capacitance between the bit line that is connected to the ferroelectric memory fuse and the bit line that is not connected to the ferroelectric memory fuse. The ferroelectric memory fuse can be accessed in the completely the same manner for reading and writing as the cell unit that is a main memory area. As a result, it is possible to drastically suppress the increase in the area of a reading and writing circuit corresponding to the ferroelectric memory fuse. In addition, it is possible to easily evaluate the ferroelectric memory fuse as a die sorter, a package, a module, or the like. It is possible to reduce the test costs of the ferroelectric memory device 74, and it is possible to drastically suppress the inconveniences involved in tests.

The invention is not limited to the embodiments, and may be variously modified within the technical scope of the invention.

For example, in Embodiments 3 and 4, D-type (normally-on type) second reset transistors may be respectively provided between the memory cell portion and the reset transistor and between the ferroelectric memory fuse and the reset transistor.

In the invention, configurations described in the following additions are conceivable.

(Addition 1) A ferroelectric memory device including: a first select transistor, of which either a source or a drain is connected to a bit line and a gate is connected to a first select line; a memory cell portion that is connected to the other the of the source and the drain of the first select transistor, and has a plurality of cascade-connected memory cells formed of ferroelectric capacitors and memory transistors; a first reset transistor that is provided between the memory cell portion and a first plate line, and a gate thereof is connected to a first reset line; a cell unit that is provided with a plurality of first select transistors, memory cell portions, and first reset transistors disposed parallel to the bit line; a second select transistor, of which either a source or a drain is connected to an end portion of the bit line and a gate is connected to a second select line; a ferroelectric memory fuse that is connected to the other one out of the source and the drain of the second select transistor, and has a plurality of cascade-connected memory cells formed of ferroelectric capacitors and memory transistors in the same number as that of the memory cell portions; and a second reset transistor that is provided between the ferroelectric memory fuse and a second plate line, and a gate thereof is connected to a second reset line, wherein the second select transistor, the ferroelectric memory fuse and the second reset transistor are disposed adjacent to the cell unit.

(Addition 2) The ferroelectric memory device according to Addition 1, wherein the memory cell portion and the ferroelectric memory fuse is 1T1C type or 2T2C type.

As described with reference to the above embodiment, there is provided a ferroelectric memory device capable of suppressing the increase of bit line capacitance even when ferroelectric memory fuses are provided.

What is claimed is:

1. A ferroelectric memory device comprising:
    a cell module comprising:
        a first select transistor comprising a first source, a first drain, and a first gate connected to a first select line, one of the first source and the first drain being connected to a bit line, and
        a memory cell module comprising a plurality of first memory cells connected serially, the first memory cells comprising a first ferroelectric capacitor and a first memory transistor connected to the first ferroelectric capacitor in parallel, the memory cell module being between a first plate line and the other of the first source and the first drain; and
    a ferroelectric memory fuse comprising:
        a second select transistor comprising a second source, a second drain, and a second gate connected to a second select line, one of the second source and the second drain being connected to a first end of the bit line; and
        a memory fuse module comprising a plurality of second memory cells connected serially, the second memory cells comprising a second ferroelectric capacitor and a second memory transistor connected to the second ferroelectric capacitor in parallel, the memory fuse module being between a second plate line and the other of the second source and the second drain,
    wherein the ferroelectric memory fuse is next to the cell module, and
    the first select transistor and the memory cell module are in parallel with the bit line.

2. The ferroelectric memory device of claim 1, wherein the first memory cells and the second memory cells are 1T1C type, 2T2C type or 6T4C type.

3. The ferroelectric memory device of claim 1, wherein the number of stage of a serial connection with respect to the first memory cells is equal to the number of stage of a serial connection with respect to the second memory cells.

4. A ferroelectric memory device comprising:
    a cell module comprising:
        a first select transistor comprising a first source, a first drain, and a first gate connected to a first select line, one of the first source and the first drain being connected to a bit line,
        a memory cell module comprising a plurality of first memory cells connected serially, the first memory cells comprising a first ferroelectric capacitor and a first memory transistor, and
        a first reset transistor between the memory cell unit and a first plate line, the first reset transistor comprising a first reset gate connected to a first reset line; and
    a ferroelectric memory fuse comprising:
        a second select transistor comprising a second source, a second drain, and a second gate connected to a second select line, one of the second source and the second drain being connected to one end of the bit line,
        a memory fuse module comprising a plurality of second memory cells connected serially, the second memory cells comprising a second ferroelectric capacitor and a second memory transistor, and
        a second reset transistor between a second plate line and the other end of the second source and the second drain, comprising a second reset gate connected to a second reset line,
    wherein the ferroelectric memory fuse is next to the cell module, and
    the first select transistor and the memory cell module are in parallel with the bit line.

5. The ferroelectric memory device of claim 4, wherein the first memory transistor comprising a memory source and a memory drain and one of the memory source and the memory drain is connected to a local bit line,
    one end of the first ferroelectric capacitor is connected to the other of the memory source and the memory drain and the other end of the first ferroelectric capacitor is connected to the first plate line, and
    one end of the local bit line is connected to the bit line via the first select transistor and the other end of the local bit line is connected to the first reset transistor.

6. The ferroelectric memory device of claim 4, wherein one end of the first ferroelectric capacitor is connected to a local bit line,
    the first memory transistor comprising a memory source and a memory drain and one of the memory source and the memory drain is connected to the other end of the first ferroelectric capacitor and the other end of the memory source and the memory drain is connected to a first plate line, and
    one end of the local bit line is connected to the bit line via the first select transistor and the other end of the local bit line is connected to the first reset transistor.

7. The ferroelectric memory device of claim 4, wherein the number of stage of a serial connection with respect to the first memory cells is equal to the number of stage of a serial connection with respect to the second memory cells.

* * * * *